United States Patent
Li

(10) Patent No.: US 9,494,853 B2
(45) Date of Patent: Nov. 15, 2016

(54) INCREASING LITHOGRAPHIC DEPTH OF FOCUS WINDOW USING WAFER TOPOGRAPHY

(71) Applicant: Spansion, LLC, Sunnyvale, CA (US)

(72) Inventor: Xiaohai Li, Santa Clara, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 295 days.

(21) Appl. No.: 14/132,422

(22) Filed: Dec. 18, 2013

(65) Prior Publication Data
US 2015/0168851 A1 Jun. 18, 2015

(51) Int. Cl.
G03B 27/42 (2006.01)
G03F 1/36 (2012.01)
G03F 7/20 (2006.01)
G03F 9/00 (2006.01)

(52) U.S. Cl.
CPC ............. *G03F 1/36* (2013.01); *G03F 7/70441* (2013.01); *G03F 7/70616* (2013.01); *G03F 9/7003* (2013.01)

(58) Field of Classification Search
CPC .... G03F 1/36; G03F 9/7003; G03F 7/70616; G03F 7/70441; G03F 17/5018; G03F 7/705; G03F 1/144; G03F 17/50
See application file for complete search history.

(56) References Cited

U.S. PATENT DOCUMENTS

| | | |
|---|---|---|
| 7,348,108 B2 | 3/2008 | Cote et al. |
| 7,694,267 B1 | 4/2010 | Ye et al. |
| 7,700,247 B2 | 4/2010 | Ausschnitt |
| 8,141,008 B2 | 3/2012 | Zach |
| 8,181,128 B2 | 5/2012 | Huang et al. |
| 8,250,498 B2 | 8/2012 | Huang et al. |
| 8,413,081 B2 | 4/2013 | Ye et al. |
| 8,532,964 B2 | 9/2013 | Wei |
| 8,576,377 B2 | 11/2013 | Hansen et al. |

*Primary Examiner* — Mesfin T Asfaw

(57) ABSTRACT

Various embodiments provide for topography aware optical proximity correction that can improve depth of focus during wafer lithography. The system can determine the topography of the wafer using real process information. The topographical variations can be based on random defects or structural details. The system can divide the wafer into regions based on the topography of the regions and determine depth of focus values for each of the regions. Optical proximity correction can then be performed on each region separately, using the separate defocus values to yield an accurate, topographically aware optical proximity correction model for the wafer. For regions with varying topography, optical proximity correction can be performed for two defocus values corresponding to the high and low extremes, such that the resulting simulated contour is satisfies a predetermined criterion associated with accuracy.

20 Claims, 9 Drawing Sheets

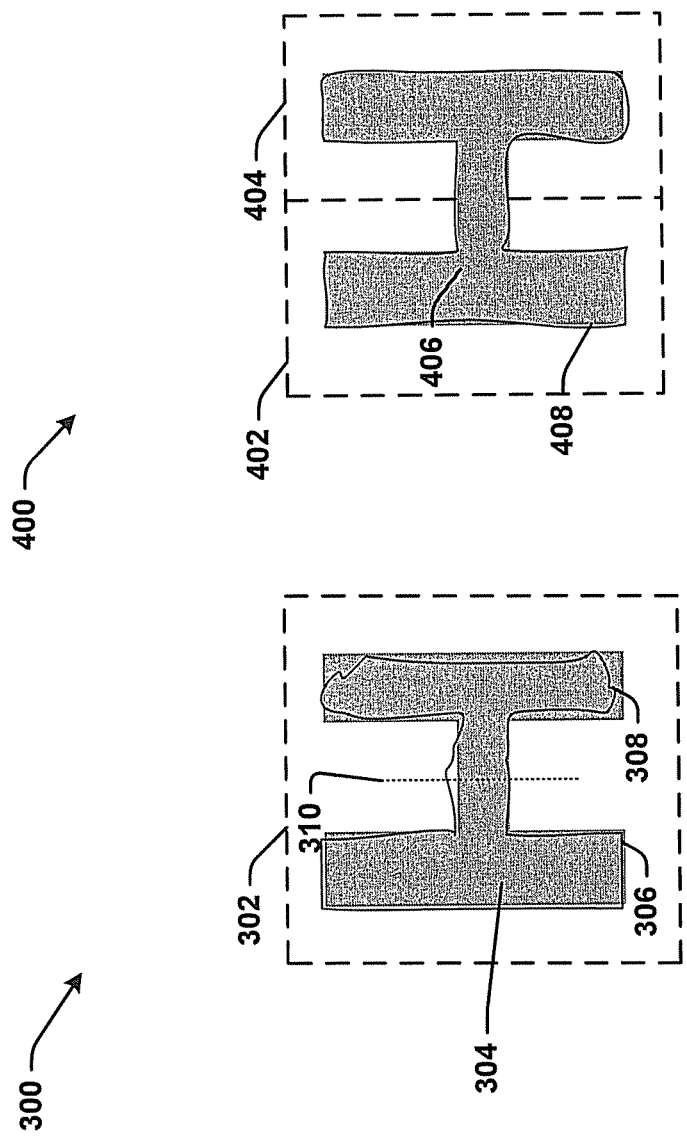

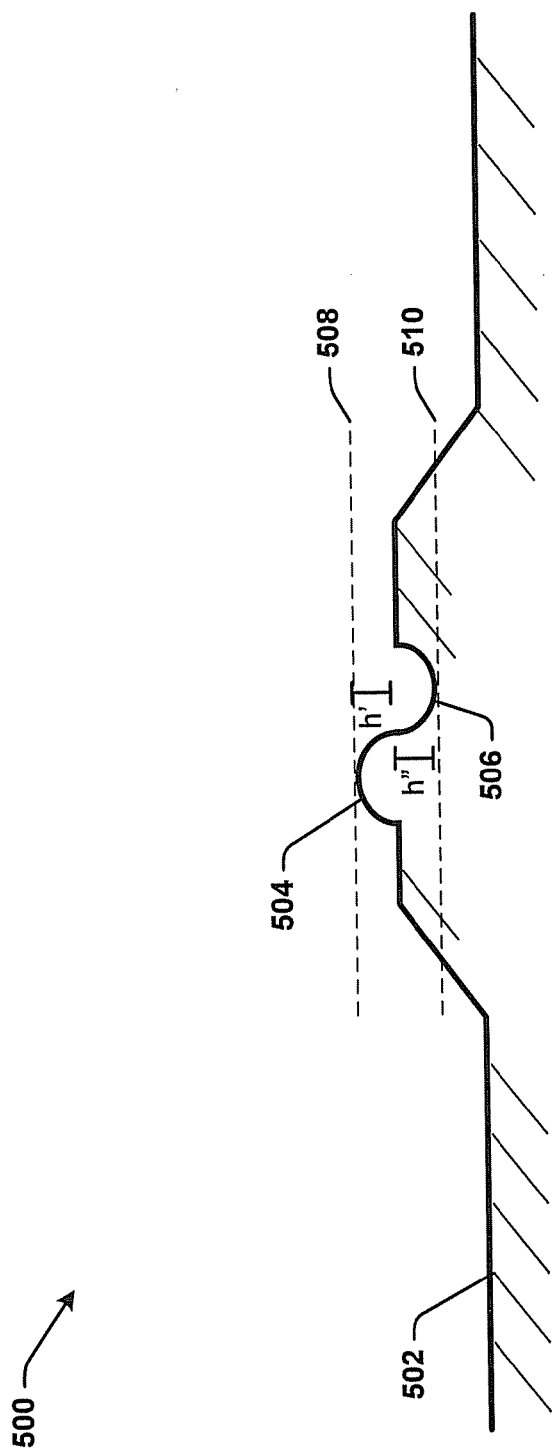

INCREASING LITHOGRAPHIC DEPTH OF FOCUS WINDOW USING WAFER TOPOGRAPHY

TECHNICAL FIELD

The subject disclosure relates to topographically aware optical proximity correction in a photolithography environment.

BACKGROUND

Photolithography is the process used in the fabrication of microchips and other integrated circuits wherein light is used to transfer a geometric pattern from a mask to a photo-sensitive chemical layer, the resist, on a substrate. Following exposure, the resist is developed to yield a relief image. Optical proximity correction is a photolithography enhancement technique commonly used to compensate for image errors due to diffraction or process effects. Optical proximity correction modifies shapes in the layout pattern so the mask compensates for dimensional distortions that occur in wafer lithography processing.

At the current scales, depth of focus margins required to accurately develop the resist and etch the substrate are small enough that wafer topography variations can affect the accuracy and outcome of the photolithography process. Depth of focus or depth of field refers to the range of distance in object spaces for which object points are imaged with acceptable sharpness with a fixed position of the image plane. Wafer topography variations, due to either defects or structural design, can leave the surface of the wafer outside of the depth of focus causing the layout pattern to be out of focus when transferred to the resist.

The above-described description is merely intended to provide a contextual overview of photolithography and optical proximity correction and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In an example embodiment, a method comprises determining a topography of a wafer and dividing the wafer into a plurality of regions based on the topography of the wafer. The method also comprises determining a first defocus value for a region of the wafer and performing optical proximity correction (OPC) on the region of the wafer using the defocus value. The method also comprises generating a simulated contour for the wafer based on results of the optical proximity correction for each region of the wafer.

In another example embodiment, a system comprises a memory that has stored thereon computer executable components and a processor that the executes the computer executable components stored in the memory. The components include a topography component that determines a topography of a wafer and a sectioning component that divides the wafer into regions based at least in part on the topography of the wafer. A defocus component is also included that determines a defocus value for each region of the wafer. An optical proximity correction component is included that performs optical proximity correction on each region of the wafer using the defocus value that corresponds to the region and generates an OPC model for each region of the wafer. A mask component is included that generates a simulated contour for the wafer based on each OPC model for each region of the wafer.

In another example embodiment, a non-transitory computer readable storage device comprising computer executable instructions, that in response to execution, cause a computing device comprising a processor to perform operations, including determining a topography of a wafer. The operations also include dividing the wafer into a plurality of regions based on the topography of the wafer and determining a first defocus value for each region of the wafer. The operations also include performing optical proximity correction on each region of the wafer using the first defocus value for each region of the wafer and generating a simulated contour for the wafer based on the results of the optical proximity correction for each region of the wafer.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

BRIEF DESCRIPTION OF THE DRAWINGS

FIG. 3 is a block diagram illustrating an example, non-limiting embodiment of a system that performs optical proximity correction that is not topography aware in accordance with various aspects described herein.

FIG. 4 is a block diagram illustrating an example, non-limiting embodiment of a system that performs optical proximity correction that is topography aware in accordance with various aspects described herein.

FIG. 5 is a block diagram illustrating an example, non-limiting embodiment of a wafer with irregular topographical variations in accordance with various aspects described herein.

DETAILED DESCRIPTION

Figure 1A:
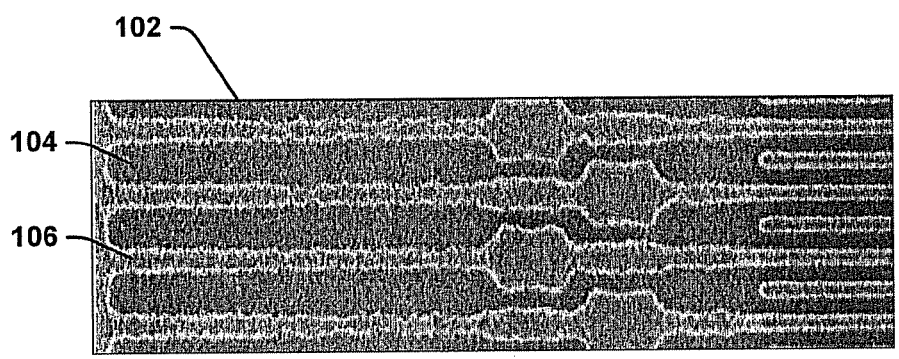
FIGS. 1A and 1B are block diagrams illustrating an example, non-limiting embodiment of a wafer with varied topography in accordance with various aspects described herein.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

Optical lithography is basically a photographic process by which a light sensitive polymer, called a photoresist, is exposed and developed to form three-dimensional relief images on the substrate. In general, the ideal photoresist image has the exact shape of the designed or intended pattern in the plane of the substrate, with vertical walls through the thickness of the resist. Thus, the final resist pattern is binary: parts of the substrate are covered with resist while other parts are completely uncovered. This binary pattern is needed for pattern transfer since the parts of the substrate covered with resist will be protected from etching, ion implantation, or other pattern transfer mechanism. Accurately exposing the photoresist is therefore critical to obtain high quality integrated circuits.

Various embodiments provide for topography aware optical proximity correction system that can increase depth of focus during optical lithography. The system can determine the topography of the wafer using real process information. The topographical variations can be based on random defects or structural details. The system can divide the wafer into regions based on the topography of the regions and determine depth of focus values for each of the regions. Optical proximity correction can then be performed on each region separately, using the separate defocus values to yield an accurate, topographically aware optical proximity correction model for the wafer. For regions with varying topography, optical proximity correction can be performed for two defocus values corresponding to the high and low extremes, such that the resulting simulated contour is satisfies a predetermined criterion associated with accuracy.

Figure 1B:
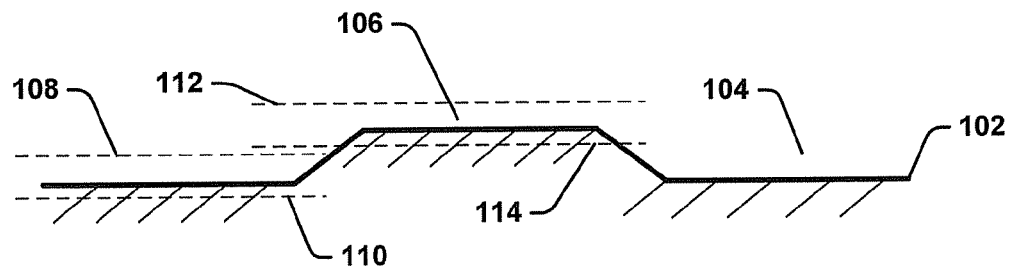

Turning now to the illustrations, FIGS. 1A and 1B are block diagrams illustrating example, non-limiting embodiments of a wafer 102 with varied topography in accordance with various aspects described herein. Wafer 102, as shown in FIG. 1A, can include areas or regions 104 and 106 that are different in height. Since the wafer 102, once completed as an integrated circuit, can include different devices such as memory cells, peripheral logics, and etc.

To facilitate these devices, the wafer 102 can include different under-layer film structures. The under-layer film structures can have varying thicknesses, thus causing the wafer 102 to have regions 104 and 106 with different heights. This range of heights can exceed the depth of focus, or depth of field ranges of the lithography system. This means that when the photoresist layer on the wafer 102 is exposed, the high and the low regions can be out of focus causing the critical dimension ("CD"), which is the minimum feature size, to be larger than it would be otherwise. The critical dimension is a function that can be expressed as:

$$CD = k_1 \cdot \frac{\lambda}{NA}$$

where $k_1$ is a coefficient, $\lambda$ is the wavelength, and NA is the numerical aperture. The CD can therefore be decreased when the numerical aperture is increased, but increasing the numerical aperture in turn decreases the depth of field. To achieving smaller CDs therefore, the systems become more sensitive to topographical variations.

FIG. 1B illustrates some of the foregoing details and provides another view of wafer 102 from a side angle. High region 106 is bounded by low region 104 on either side. To accurately expose wafer 102, the lithographic system would use depth of field with a high and low range of 108 and 110 to expose region 104, and a depth of field with a high and low range of 112 and 114 to expose region 106. Instead of changing the depth of field however when exposing the region, the lithographic system of the subject application can use different defocus values for regions 104 and 106 when creating the simulated contour during the optical proximity correction process. The simulated contour can then be used to generate the mask that can accurately expose the photoresist on wafer 102 in low region 104 as well as high region 106.

Figure 2:
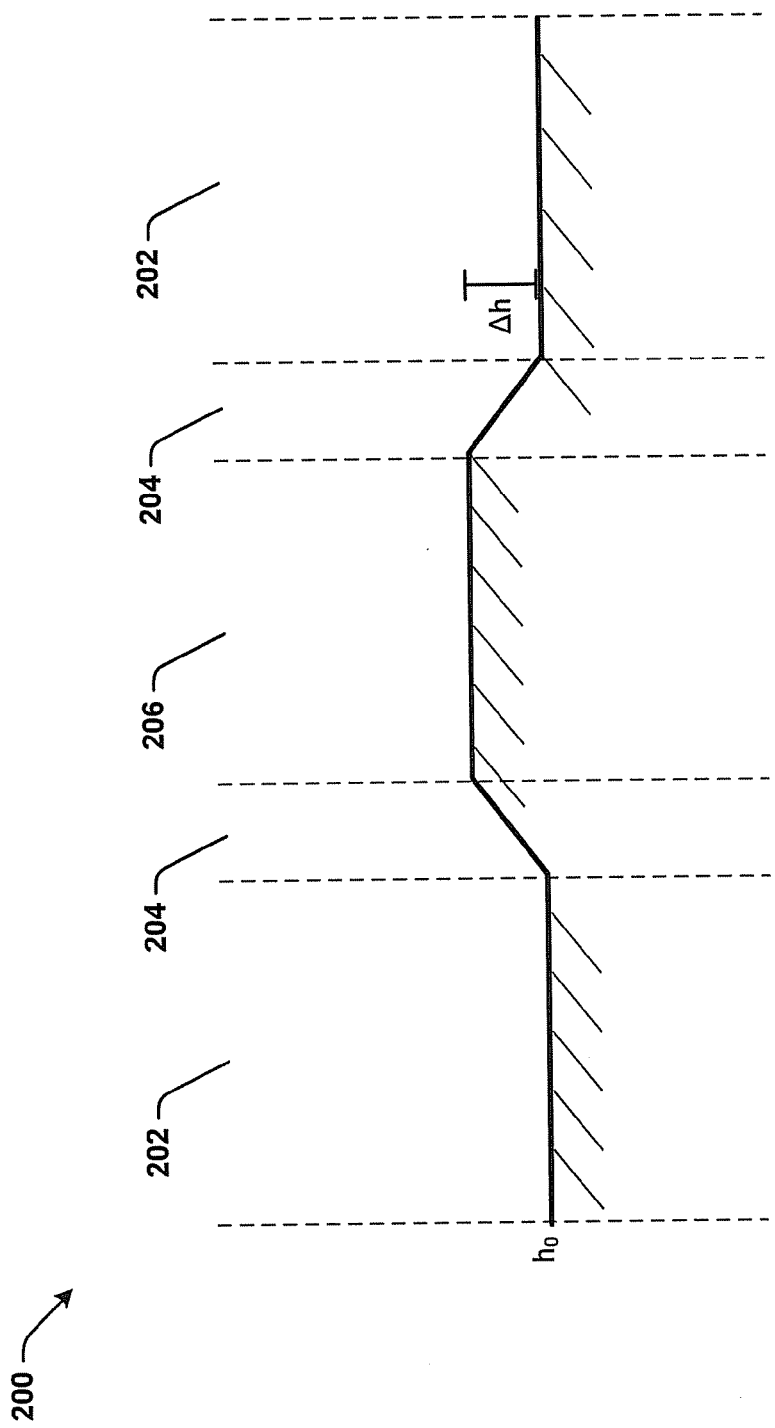
FIG. 2 is a block diagram illustrating an example, non-limiting embodiment of a wafer divided into regions in accordance with various aspects described herein.

Turning now to FIG. 2, illustrated is a block diagram of an example, non-limiting embodiment 200 of a wafer divided into regions in accordance with various aspects described herein. The wafer regions 202, 204, and 206 can be based on the height and/or topography of the regions. In an embodiment, the lithography system can separate the wafer into the regions based on real process information. The real process information can include live processes that detect and/or otherwise determine the wafer height and determining the wafer height based on the wafer design and intended use.

In an embodiment, the real process information can include information received from sensors such as grazing incidence height sensors and other means for determining the height of a wafer that are known to those having ordinary skill in the art. The system can also determine the height of the wafer by analyzing the wafer design and schematics. Based on this analysis, the regions with thicker under-layer film structures can be determined, and thus the heights of the regions can be estimated or otherwise determined.

The regions are divided such that areas that use similar defocus values are grouped together. For example, in the embodiment show in FIG. 2, region 202 represents an area where the defocus value is determined using the calibrated optical proximity correction model software. The initial defocus value, $h_0$, of region 202, is the calibrated defocus value obtained from the optical proximity correction software assuming a flat wafer. The region 206 initial defocus value is $h_0 + \Delta h$ where $\Delta h$ is proportional to the measured topographical height difference between region 202 and region 206. Within each defined topographical region, the optical proximity correction software generates the contours of the simulated resist image by comparing the simulated resist image values to a predetermined threshold value. The optical proximity correction software can then compares the simulated contours with the input target pattern at all of the control points to determine if the design layout will deliver the desired patterning performance. If the design parameters are not satisfied, the defocus value for that topographical region is modified and the simulation is rerun with the process continuing until the specified design parameters with that region are satisfied.

Also in FIG. 2, region 204 represents the topographical transition region between topographical regions 202 and 206. At this transition region, the defocus value can be determined by averaging the optical proximity correction model defocus values of the adjacent regions, performing a weighted sum of the optical proximity correction model defocus values based on the distance between the different topographical regions, performing a least squares polynomial regression fit between regions based on their topographic profiles, or by using a more complex function based on the real topographical profile of the wafer. This process is repeated until all the defocus values for the different topographical transition regions have been determined.

FIG. 3 is a block diagram illustrating an example, non-limiting embodiment 300 of a system that performs optical proximity correction that is not topography aware. The wafer 302 has two regions of a different height 310 on the left, and 312 on the right. In this embodiment, the optical proximity correction was performed based on a defocus value associated with the region 310. Accordingly, the simulated contour 306 for the region 310 accurately matches the shape of the desired layout 304. Because the defocus value of the optical proximity correction process matches the height of the region 310, the optical proximity correction correctly compensated for image errors due to diffraction and other process effects. By contrast however, since the height of the region 312 is different than region 310, but the same defocus value was used during optical proximity correction, the simulated contour 308 on the right side doesn't match the desired layout 304 as well as in region 310.

The embodiment 400 shown in FIG. 4 however has been corrected using the topography aware optical proximity correction process of the subject application. In 400, the wafer 402 similarly has different heights in regions 408 and 410, but the system can determine the topography of the wafer 402 and determine defocus values for each of regions 408 and 410. Then, when performing optical proximity correction, the simulated contour 406 can match the desired layout 404 closely in both regions 408 and 410.

Turning now to FIG. 5, illustrated is a block diagram of an example, non-limiting embodiment 500 of a wafer 502 with irregular topographical variations in accordance with various aspects described herein. A region of the wafer can have irregular topographical variations due to poly bumps or other embedded contaminations due to particle residue incoming to or fallen during poly silicon deposition. The irregularities can be either bumps rising above the surface of the wafer (e.g., 504) to a height h', or depressions falling below the surface of the wafer (e.g., 506) to a depth h". If either the bump 504 or the depression 506 fall outside the depth of focus window, the optical proximity correction process may not accurately adjust the simulated contour to take the topographical variations into consideration.

Since the areas for these irregular topographical variations can be small in some embodiments, rather than dividing the areas associated with the bump 504 and the depression 506 into their own regions, the system of the subject application can run optical proximity correction with extreme defocus values corresponding to h' and h" for bump 504 and depression 506 respectively.

In the case of a random defect caused by the depression 506, one extreme initial defocus value 510 is $h_0+\Delta h-h"$; where the initial defocus value, $h_0$, is the calibrated defocus value obtained from the optical proximity correction software assuming a level wafer, $\Delta h"$ is proportional to the measured topographical height difference between the topographical region height where the depression 506 is located and the height from which the calibrated defocus value was obtained, and h" is proportional to the depth of the defect.

In the case of a random defect caused by the bump 504, the other extreme initial defocus value 508 is $h_0+\Delta h+h'$; where the initial defocus value, $h_0$, is the calibrated defocus value obtained from the optical proximity correction software assuming a flat wafer, $\Delta h'$ is proportional to the measured topographical height difference between the topographical region height where the defect is located and the height from which the calibrated defocus value was obtained, and h' is proportional to the height of the defect.

Optical proximity correction model iterations are then performed taking into account the two extreme defocus values 508 and 510 for the random defects for that region. This iterative process continues until the final critical dimension correction values are within the specified tolerances set by the mask design rules and satisfy a predetermined criterion associated with accuracy.

Figure 6:
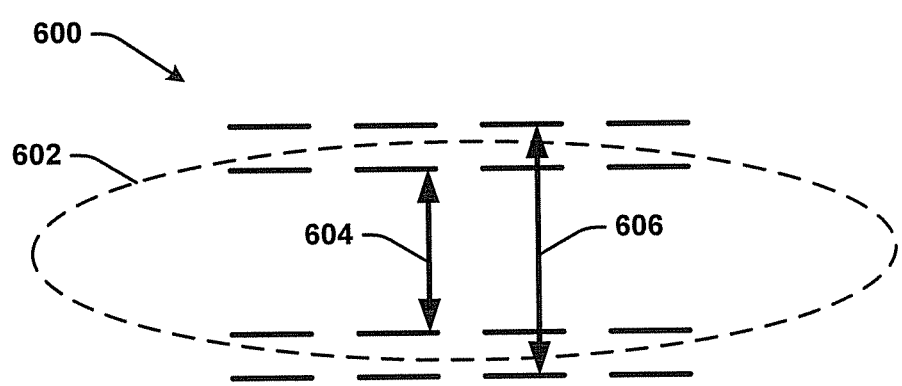
FIG. 6 is a block diagram illustrating an example, non-limiting embodiment of a system that performs topography aware optical proximity correction in accordance with various aspects described herein.

Turning now to FIG. 6, illustrated is a block diagram of an example, non-limiting embodiment 600 of a system that performs topography aware optical proximity correction in accordance with various aspects described herein. The embodiment 600 shows a simulated contour for the extreme defocus values show in FIG. 5 (e.g., 508 and 510). Boundaries 604 identify the minimum allowed trace range and boundaries 606 identify the maximum allowed trace range for a given trace 602 in the specification. After optical proximity correction model iteration is complete, simulated contours are within the specified tolerances for the design, otherwise the defocus values are modified and the optical proximity correction simulation is repeated. This iterative process continues until the final critical dimension correction values are with the specified tolerances set by the mask design rules and based on a predetermined criterion associated with accuracy.

Figure 7:
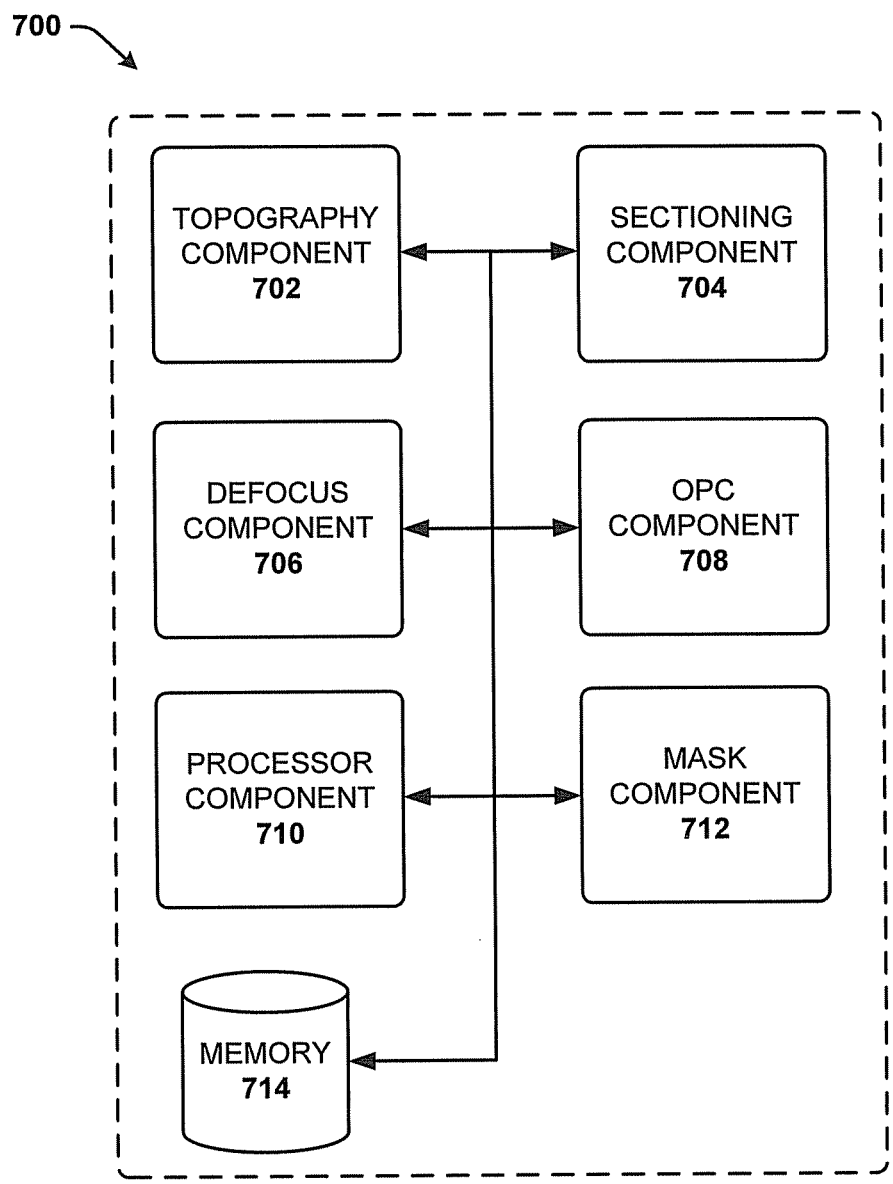
FIG. 7 is a block diagram illustrating an example, non-limiting embodiment of a system that performs topography aware optical proximity correction in accordance with various aspects described herein.

Referring now to FIG. 7, illustrated is a block diagram of an example, non-limiting embodiment of a system 700 that performs topography aware optical proximity correction in accordance with various aspects described herein. System 700 can include a memory 714 that has stored thereon computer executable components and a processor 710 that executes the following computer executable components stored in the memory.

A topography component 702 can be included that determines a topography of a wafer. The topography can be determined using real process information such by using graze incidence height sensors that detect reflected light incident on the wafer. The topography component 702 can also determine the topography of the wafer based on information received about the design and/or intended use of the wafer as well as based on an analysis of the wafer schematics.

A sectioning component 704 can also be included that divides a wafer into regions based at least in part on the topography of the wafer. The sections can in some embodiments correspond to the regions of similar height on the wafer, and in other embodiments correspond to areas of the wafer that have similar structures on the wafer. Once sectioned, a defocus component 706 can determine defocus values for each of the regions sectioned by the sectioning component 704.

For regions on wafer that are transitional between a high and a low height, the defocus component 706 can generate defocus values that are averaged defocus values of adjacent regions based on a weighted sum of the defocus values based on the distance between the adjacent regions. In other embodiments, the defocus values of the transition regions can be based on averaged defocus values of adjacent regions based on a least squares polynomial regression fit between regions based on topographic profiles.

In an embodiment, for regions of the wafer that have been determined by the topographical component 702 to have irregular topographies with one or more topographical variations, the defocus component 706 can determine two defocus values for the region, where the two defocus values correspond to an extreme low and an extreme high topographical variation.

An optical proximity correction component 708 can perform optical proximity correction on each region of the wafer using the defocus value that corresponds to the region and generates an OPC model for each region of the wafer. And a mask component 712 can generate a simulated contour for the wafer based on each OPC model for each region of the wafer.

In an embodiment where there are irregular topographies and there are two defocus values corresponding to high and low heights, the optical proximity correction component 708 can perform optical proximity correction on the region using the two defocus values for the region, and the mask component 712 generates a second simulated contour for the region such that the simulated contours for each of the two defocus values satisfies a predetermined criterion associated with accuracy.

Figure 8:
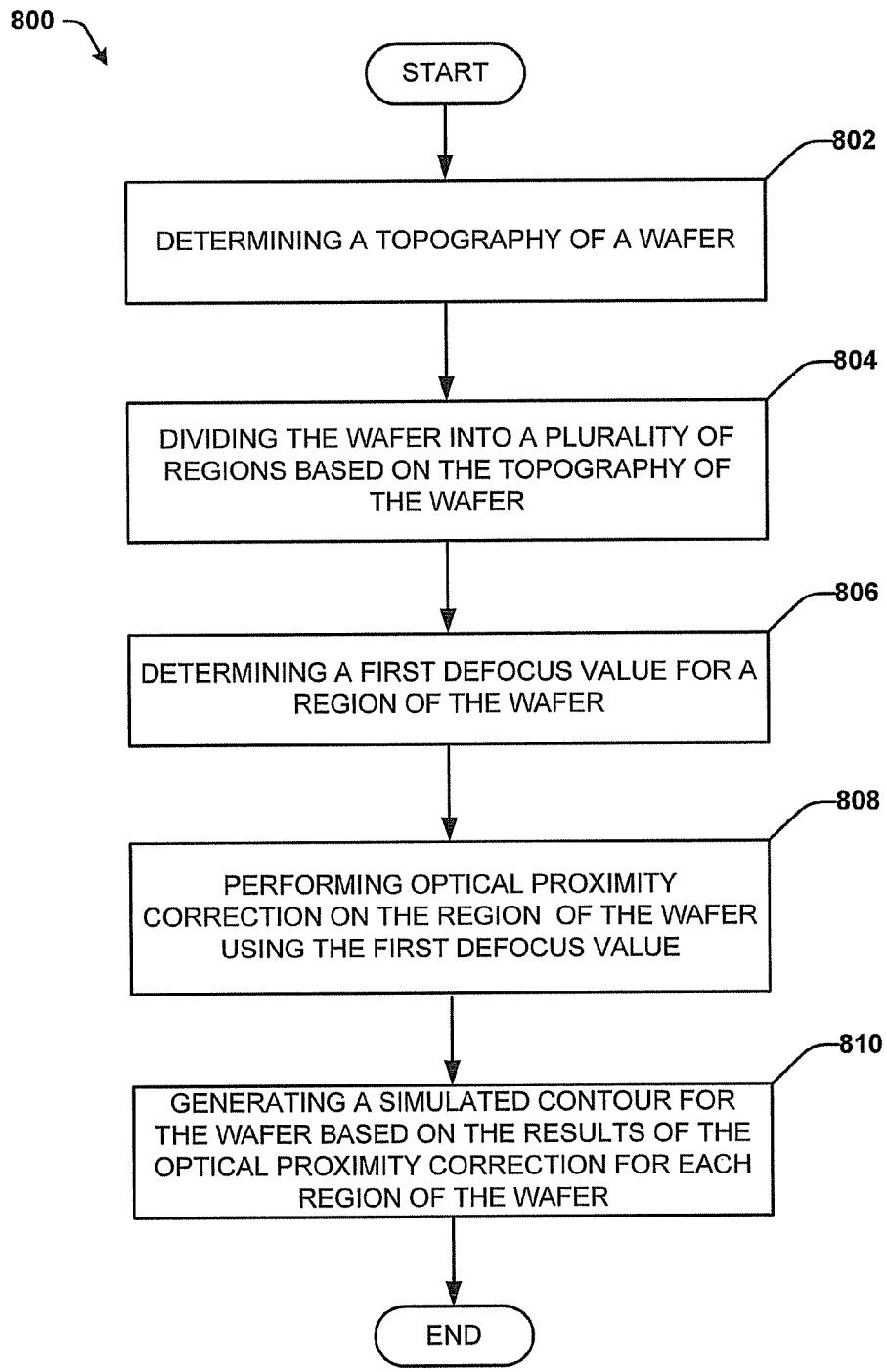
FIG. 8 illustrates a flow diagram of an example, non-limiting embodiment of a method for performing topography aware optical proximity correction.
Figure 9:
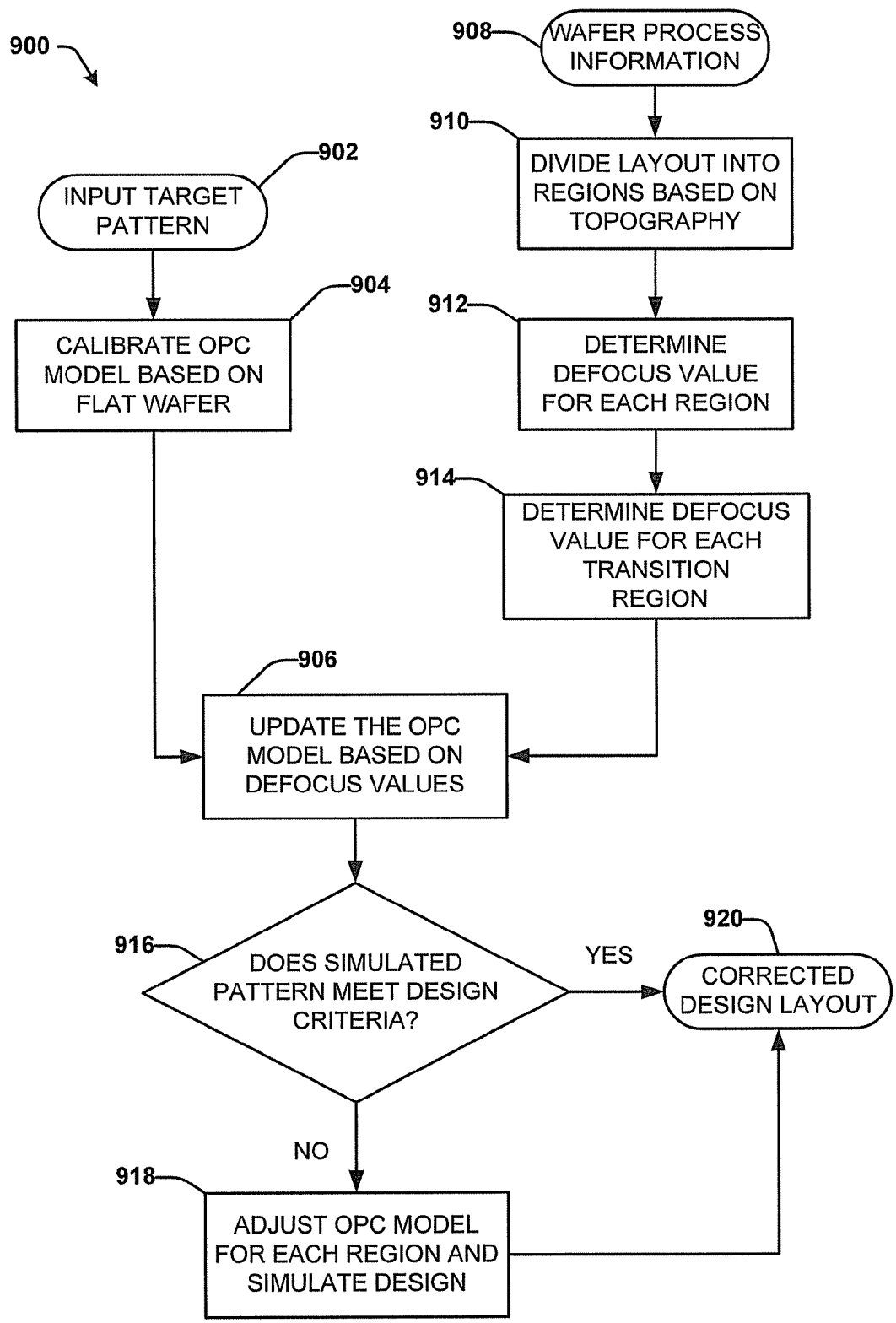
FIG. 9 illustrates a flow diagram of an example, non-limiting embodiment of a method for performing topography aware optical proximity correction.

FIGS. 8-9 illustrate processes in connection with the aforementioned systems. The process in FIG. 8-9 can be implemented for example by system 700 illustrated in FIG. 7. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

FIG. 8 illustrates a flow diagram of an example, non-limiting embodiment of a method 800 for performing topography aware optical proximity correction. Method 800 can start at 802, where a topography of a wafer can be determined (e.g., by topography component 702). The topography can be determined using real process information such by using graze incidence height sensors that detect reflected light incident on the wafer. The topography can also be determined based on information received about the design and/or intended use of the wafer as well as based on an analysis of the wafer schematics.

At 804, the wafer is divided into a plurality of regions based on the topography of the wafer (e.g., by sectioning component 704). The sections can in some embodiments correspond to the regions of similar height on the wafer, and in other embodiments correspond to areas of the wafer that have similar structures on the wafer.

Once sectioned, at 806, a first defocus value can be determined for a region of the wafer (e.g., by defocus component 706). For regions on wafer that are transitional between a high and a low height, defocus values can be generated that are averaged defocus values of adjacent regions based on a weighted sum of the defocus values based on the distance between the adjacent regions. In other embodiments, the defocus values of the transition regions can be based on averaged defocus values of adjacent regions based on a least squares polynomial regression fit between regions based on topographic profiles.

At 808, optical proximity correction is performed (e.g., by optical proximity correction component 708) on the region of the wafer using the first defocus value. In an embodiment where there are irregular topographies and there are two defocus values corresponding to high and low heights, the optical proximity correction can be performed on the region using the two defocus values for the region. At 810, a simulated contour is generated (e.g., by mask component 712) for the wafer based on the results of the optical proximity correction for each region of the wafer.

FIG. 9 illustrates a flow diagram of an example, non-limiting embodiment of a method 900 for performing topography aware optical proximity correction. As shown in FIG. 9, an input target pattern 902 is provided. For example, the input target pattern 902 is inputted into a computer system (not shown). The input target pattern 902 refers to the desired pattern that will be formed on the semiconductor photoresist layer (not shown) when the lithographic process is complete and reflects the layout of the electrical circuit.

The optical proximity correction software simulates the printed resist image on the wafer by applying the optical model and the resist model to the pre-optical proximity correction layout input target pattern 902. The optical proximity correction model 904 is calibrated assuming a planar wafer using the nominal and finite element model critical dimension data for the input design. The optical proximity correction software generates the contours of the simulated resist image by comparing the simulated resist image values to a predetermined threshold value. The optical proximity correction software then compares the simulated contours with the input target pattern 902 at all of the control points to determine if the design layout will deliver the desired patterning performance. This comparison is typically defined as a critical dimension at each control point. The result is a calibrated optical proximity correction model 904.

At 908 wafer process information is analyzed to determine the wafer topography, and at 910, the layout, or the wafer is divided into regions based on the topography determined at 908. At 912, the defocus value is determined for each region and for each transition region at 914. At 906, the OPC model that was calibrated at 904 is updated with the defocus values determined at steps 912 and 914.

A simulated contour or pattern is generated at 916 based on the updated OPC model, and it is determined whether or not the simulated contour satisfies a predetermined accuracy standard. If it does, a mask or corrected design layout is generated based on the simulated contour at 920. If it doesn't satisfy the predetermined criteria, the OPC model is adjusted at 918 and a design is simulated for each region until the standards are met.

Example Computing Environment

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the appended claims. Furthermore, to the extent that the term "includes" "has" or "having" are used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

Figure 10:
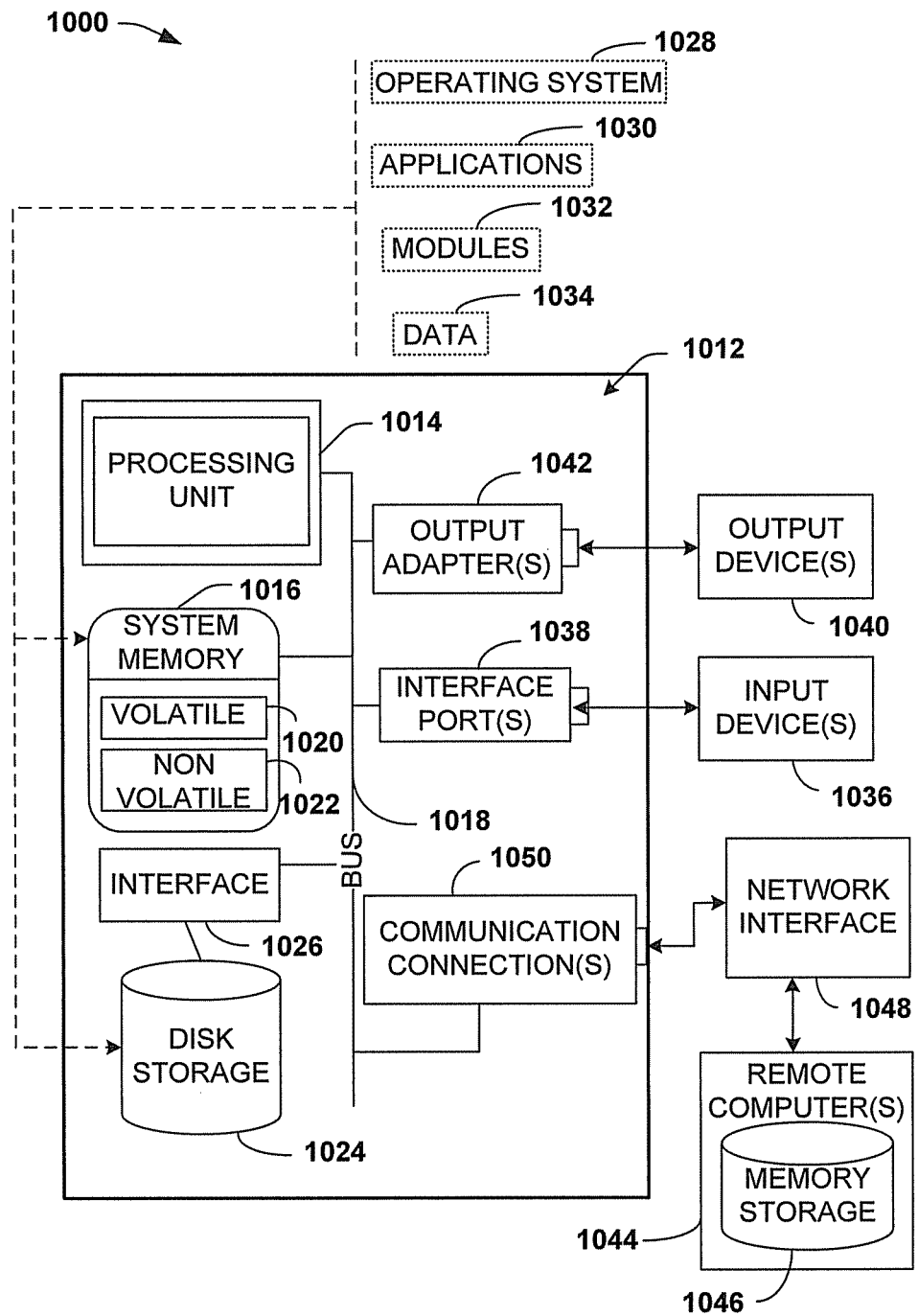
FIG. 10 illustrates a block diagram of an example electronic computing environment that can be implemented in conjunction with one or more aspects described herein.

In order to provide a context for the various aspects of the disclosed subject matter, FIG. 10, as well as the following discussion, is intended to provide a brief, general description of a suitable environment in which various aspects of the disclosed subject matter can be implemented or processed. While the subject matter has been described above in the general context of semiconductor architectures and process methodologies for manipulating semiconductor devices of such architectures, those skilled in the art will recognize that the subject innovation also may be implemented in combination with other architectures or process methodologies. Moreover, those skilled in the art will appreciate that the inventive processes may be practiced with a processing system or a computer processor, either alone or in conjunction with a host computer, which can include single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a Flash memory module. In a distributed computing environment, program modules may be located in both local and remote memory storage modules or devices.

With reference to FIG. 10, a suitable environment 1000 for implementing various aspects of the claimed subject matter can include a host computer 1012. The host computer 1012 includes a processing unit 1014, a system memory 1016, and a system bus 1018. The system bus 1018 connects system components including, but not limited to, the system memory 1016 to the processing unit 1014. The processing unit 1014 can be any of various available processors. Dual microprocessors and other multiprocessor architectures also can be employed as the processing unit 1014.

The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1016 includes volatile memory 1020 and nonvolatile memory 1022. The basic input/output system (BIOS), containing the basic routines to transfer information between elements within the computer 1012, such as during start-up, is stored in nonvolatile memory 1022. By way of illustration, and not limitation, nonvolatile memory 1022 can include ROM, PROM, EPROM, EEPROM, or Flash memory (e.g., AND Flash, NAND Flash, NOR Flash, CT-NOR Flash, CT-NAND Flash, and so on). Furthermore, nonvolatile memory 1022 can provide the platform for the various semiconductor architectures described herein. Volatile memory 1020 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synch link DRAM (SLDRAM), Rambus direct RAM (RDRAM), direct Rambus dynamic RAM (DRDRAM), and Rambus dynamic RAM (RDRAM).

Host computer 1012 also includes removable/non-removable, volatile/non-volatile computer storage media. FIG. 10 illustrates, for example, a disk storage 1024. Disk storage 1024 includes, but is not limited to, devices like a magnetic disk drive, floppy disk drive, tape drive, Jaz drive, Zip drive, LS-100 drive, flash memory card, or memory stick. In addition, disk storage 1024 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). Furthermore, disk storage 1024 can provide the platform for the various semiconductor architectures described herein. To facilitate connection of the disk storage devices 1024 to the system bus 1018, a removable or non-removable interface is typically used, such as interface 1026.

It is to be appreciated that FIG. 10 describes software that acts as an intermediary between users and the basic computer resources described in the suitable operating environment 1000. Such software includes an operating system 1028. Operating system 1028, which can be stored on disk storage 1024, acts to control and allocate resources of the host computer system 1012. System applications 1030 take advantage of the management of resources by operating system 1028 through program modules 1032 and program data 1034 stored either in system memory 1016 or on disk storage 1024. It is to be appreciated that the disclosed subject matter can be implemented with various operating systems or combinations of operating systems.

A user enters commands or information into the host computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port may be used to provide input to host computer 1012 and to output information from host computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Host computer 1012 can operate in a networked environment using logical connections to one or more remote computers, such as remote computer(s) 1044. The remote computer(s) 1044 can be a personal computer, a server, a router, a network PC, a workstation, a microprocessor based appliance, a peer device or other common network node and the like, and typically includes many or all of the elements described relative to host computer 1012. For purposes of brevity, only a memory storage device 1046 is illustrated with remote computer(s) 1044. Remote computer(s) 1044 is logically connected to host computer 1012 through a network interface 1048 and then physically connected via communication connection 1050. Network interface 1048 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1050 refers to the hardware/software employed to connect the network interface 1048 to the bus 1018. While communication connection 1050 is shown for illustrative clarity inside host computer 1012, it can also be external to host computer 1012. The hardware/software necessary for connection to the network interface 1048 includes, for exemplary purposes only, internal and external technologies such as, modems including regular telephone grade modems, cable modems and DSL modems, ISDN adapters, and Ethernet cards.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes. In addition, while a particular feature may have been disclosed with respect to only one of several implementations, such feature may be combined with one or more other features of the other implementations as may be desired and advantageous for any given or particular application.

Other than where otherwise indicated, all numbers, values and/or expressions referring to quantities of items such as memory size, etc., used in the specification and claims are to be understood as modified in all instances by the term "about."

What is claimed is:

1. A method, comprising:
    determining a topography of a wafer;
    dividing the wafer into a plurality of regions based on the topography of the wafer;
    determining a first defocus value for a region of the wafer;
    performing optical proximity correction on the region of the wafer using the first defocus value; and
    generating a first simulated contour for the wafer based on results of the optical proximity correction for each region of the wafer.

2. The method of claim 1, further comprising:
    determining that the region of the wafer has a sub-region that is different in height than the region; and
    determine a second defocus value for the sub region based on a difference in height of the sub-region.

3. The method of claim 2, further comprising:
    performing optical proximity correction using the first defocus value and the second defocus value; and
    generating a second simulated contour for the wafer such that the simulated contours for each defocus value satisfies a predetermined criterion associated with accuracy.

4. The method of claim 1, further comprising:
    determining that another region of the wafer corresponds to a transition zone; and
    determining another defocus value for the transition zone.

5. The method of claim 4, wherein the determining the other defocus value for the transition zone further comprises averaging defocus values for adjacent regions by performing at least one of a: weighted sum of the defocus values based on the distance between the adjacent regions or least squares polynomial regression fit between regions based on topographic profiles.

6. The method of claim 1, wherein determining the topography further comprises determining the topography by using a real process information for a manufactured wafer.

7. The method of claim 6, wherein the dividing the wafer into a plurality of regions further comprises determining the plurality of regions based on topographical differences in the real process information of the manufactured wafer.

8. The method of claim 1, wherein the performing optical proximity correction further comprises:
retrieving a calibrated optical proximity model based on a flat wafer;
incorporating the defocus value for each topographical region of the wafer; and
iterating until the optical proximity model simulated contours are within predetermined design tolerances.

9. A system, comprising:
a memory that has stored thereon computer executable components;
a processor that executes the following computer executable components stored in the memory:
a topography component that determines a topography of a wafer;
a sectioning component that divides a wafer into regions based at least in part on the topography of the wafer;
a defocus component that determines a defocus value for each region of the wafer;
a optical proximity correction (OPC) component that performs optical proximity correction on each region of the wafer using the defocus value that corresponds to the region and generates an OPC model for each region of the wafer; and
a mask component that generates a simulated contour for the wafer based on each OPC model for each region of the wafer.

10. The system of claim 9, wherein the topography component determines that a region of the wafer has random topographical variations and the defocus component determines two defocus values for the region, the two defocus values corresponding to an extreme low and an extreme high topographical variation.

11. The system of claim 10, wherein OPC component performs optical proximity correction on the region using the two defocus values for the region, and the mask component generates a second simulated contour for the region such that the simulated contours for each of the two defocus values satisfies a predetermined criterion associated with accuracy.

12. The system of claim 9, wherein the sectioning component determines that a region of the wafer corresponds to a transition zone and the defocus component determines a defocus value for the transition zone.

13. The system of claim 12, wherein the defocus value of the transition zone is an averaged defocus value of adjacent regions based on a weighted sum of the defocus values based on the distance between the adjacent regions.

14. The system of claim 12, wherein the defocus value of the transition zone is an averaged defocus value of adjacent regions based on a least squares polynomial regression fit between regions based on topographic profiles.

15. The system of claim 12, wherein the topography component determines the topography of the wafer based on real process information for a manufactured wafer.

16. The system of claim 12, wherein the sectioning component divides the wafer into the regions based on topographical differences in the real process information of the manufactured wafer.

17. The system of claim 12, wherein the OPC component is configured to:
retrieve a calibrated optical proximity model based on a flat wafer;
incorporate the defocus value for each topographical region of the wafer; and
iterate until the optical proximity model simulated contours are within predetermined design tolerances.

18. A non-transitory computer readable storage device comprising computer executable instructions that, in response to execution, cause a computing device comprising a processor to perform operations comprising:
determining a topography of a wafer;
dividing the wafer into a plurality of regions based on the topography of the wafer;
determining a first defocus value for each region of the wafer;
performing optical proximity correction on each region of the wafer using the first defocus value corresponding to the region; and
generating a simulated contour for the wafer based on results of the optical proximity correction for each region of the wafer.

19. The non-transitory computer readable storage device of claim 18, wherein the operations further comprise:
determining that a region of the wafer has a sub-region that is different in height than the region; and
determine a second defocus value for the sub region based on a difference in height of the sub-region.

20. The non-transitory computer readable storage device of claim 18, wherein the operation further comprise:
performing optical proximity correction using the first defocus value and the second defocus value; and
generating a second simulated contour for the wafer such that the simulated contours for each defocus value satisfies a predetermined criterion associated with accuracy.

* * * * *